United States Patent [19]

Stahlhofen et al.

[11] Patent Number: 4,889,788
[45] Date of Patent: Dec. 26, 1989

[54] PHOTOSENSITIVE COMPOSITION, PHOTOSENSITIVE COPYING MATERIAL PREPARED FROM THIS COMPOSITION WITH THERMAL HARDENING SYMMETRIC TRIAZINE ALKYL(ARYL)-ETHER

[75] Inventors: Paul Stahlhofen; Hans W. Frass, both of Wiesbaden, Fed. Rep. of Germany

[73] Assignee: Hoechst Aktiengesellschaft, Frankfurt am Main, Fed. Rep. of Germany

[21] Appl. No.: 224,725

[22] Filed: Jul. 27, 1988

[30] Foreign Application Priority Data

Aug. 5, 1987 [DE] Fed. Rep. of Germany ....... 3725949

[51] Int. Cl.$^4$ .......................... G03C 1/60; G03C 1/495
[52] U.S. Cl. ..................... 430/191; 430/165; 430/192; 430/270; 430/626
[58] Field of Search ............... 430/191, 192, 165, 270, 430/626, 920

[56] References Cited

U.S. PATENT DOCUMENTS

| | | | |
|---|---|---|---|
| 3,402,044 | 9/1968 | Steinhoff et al. | 430/192 |
| 3,515,552 | 6/1970 | Smith | 96/35.1 |
| 3,536,489 | 10/1970 | Smith | 96/28 |
| 3,645,743 | 2/1972 | Mucke et al. | 430/626 |
| 3,779,778 | 12/1973 | Smith et al. | 96/115 R |
| 3,954,475 | 5/1976 | Bonham et al. | 430/920 |
| 4,101,323 | 7/1978 | Buhr et al. | 96/35 |
| 4,104,070 | 8/1978 | Moritz et al. | 96/36 |
| 4,153,461 | 5/1979 | Berghäuser et al. | 96/75 |
| 4,189,323 | 2/1980 | Buhr | 430/281 |
| 4,196,003 | 4/1980 | Watanabe | 430/193 |
| 4,247,611 | 1/1981 | Sander et al. | 430/286 |
| 4,248,957 | 2/1981 | Sander et al. | 430/270 |
| 4,250,247 | 2/1981 | Sander et al. | 430/270 |
| 4,279,982 | 7/1981 | Iwasaki et al. | 430/170 |
| 4,311,782 | 1/1982 | Buhr et al. | 430/270 |
| 4,320,189 | 3/1982 | Taguchi et al. | 430/920 |
| 4,387,152 | 6/1983 | Stahlhofen | 430/191 |
| 4,404,272 | 9/1983 | Stahlhofen | 430/191 |
| 4,506,006 | 3/1985 | Ruckert | 430/325 |
| 4,576,901 | 3/1986 | Stahlhofen et al. | 430/325 |
| 4,581,321 | 4/1986 | Stahlhofen | 430/325 |
| 4,619,998 | 10/1986 | Buhr | 544/193.1 |

FOREIGN PATENT DOCUMENTS

| | | | |
|---|---|---|---|
| 565734 | 12/1987 | Australia | 430/192 |
| 164248 | 11/1985 | European Pat. Off. | 430/192 |
| 1388492 | 3/1975 | United Kingdom . | |
| 2009437 | 6/1979 | United Kingdom . | |
| 2082339 | 3/1982 | United Kingdom . | |

OTHER PUBLICATIONS

Dudley et al., "Cyanuric Chloride Derivatives. III. Alkoxy-s-triazines," The Journal of the American Chemical Society, vol. LXXIII, Jul.-Sep. 1951, pp. 2986-2992.
De Forest, W. S., Photoresist Materials and Processes, McGraw-Hill Book Co., 1975, pp. 47-59.

Primary Examiner—Charles L. Bowers, Jr.
Attorney, Agent, or Firm—Foley & Lardner, Schwartz, Jeffery, Schwaab, Mack, Blumenthal & Evans

[57] ABSTRACT

The invention describes a photosensitive composition, a copying material prepared from this composition, and a process for the production of negative relief copies, in which a photosensitive composition or a photosensitive material, respectively, is used, that comprises a support and a photosensitive composition coated onto the support and comprising a photosensitive 1,2-quinonediazide or a photosensitive mixture, a binder that is soluble in aqueous-alkaline solutions and an s-triazine of the general formula I

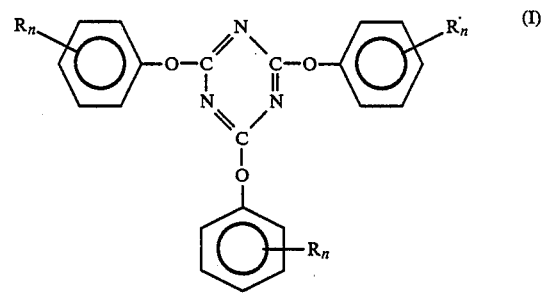

wherein
  R denotes akyl, allyl, alkoxy, alkoxycarbonyl, alkoxycarbonylakkenyl, each having from 1 to 4 carbon atoms in the alkyl or alkenyl group, aryloxy, halogen or a nitro group and
  n stands for 1 to 3. The material is exposed imagewise under a negative original, thereafter heated and, after cooling, exposed without an original or optionally under a positive original, then developed by means of an aqueous-alkaline developer and optionally baked. The copying material has a relatively large treatment range during the heating step and can be used for the production of negative and positive printing forms and in the photocomposing process.

5 Claims, No Drawings

PHOTOSENSITIVE COMPOSITION, PHOTOSENSITIVE COPYING MATERIAL PREPARED FROM THIS COMPOSITION WITH THERMAL HARDENING SYMMETRIC TRIAZINE ALKYL(ARYL)-ETHER

BACKGROUND OF THE INVENTION

The present invention relates to a photosensitive composition comprising a binder which is insoluble in water and soluble in aqueous-alkaline solutions, a photosensitive 1,2-quinonediazide or a photosensitive mixture comprising a compound which splits off acid upon exposure to light and a compound containing at least one acid-cleavable C-O-C group, and a symmetric triazine-alkyl(aryl)-ether as a substance which promotes thermal hardening. The invention also relates to a copying material which is prepared from a layer support and a photosensitive layer comprising said composition and to processes for the production of negative relief copies by exposing, heating, overall exposing, developing and optionally baking a normally positive-working copying material.

Positive-working photosensitive compositions, the image-wise exposed areas of which become soluble in a developer solution and the unexposed areas of which remain insoluble, are known in the art. For the preparation of such materials, layers containing o-quinonediazides as photosensitive compounds and which additionally contain resins with groups providing alkaline solubility, for example phenolic resins, are primarily used in practice.

Photosensitive compositions based on acid-cleavable compounds are also known. They contain orthocarboxylic acid derivatives, monomeric or polymeric acetals, enol ethers or acylimino carbonates as the acid-cleavable compounds. The radiation-sensitive compounds splitting off acid that are contained in these compositions predominantly comprise organic halogen compounds, in particular, s-triazines substituted by methyl halide groups. The binders used comprise resins with groups providing alkaline solubility.

It is also known that a normally positiveworking copying material based on o-quinonediazides can be used as a negative-working copying material, in the presence of appropriate additives and by a particular sequence of treatments. British Patent Application No. 2 082 339 describes a reversal process of that kind, in which a photosensitive mixture comprising an o-quinonediazide and at least one resol is employed as a negative-working recording material. German Offenlegungsschrift No. 25 29 054 (corresponding to U.S. Pat. No. 4,104,070) describes resist layers based on 1,2-quinonediazides for use in a reversal process. These layers contain a hydroxyethylimidazoline as an additive. A similar material containing secondary or tertiary amines is disclosed in U.S. Pat. No. 4,196,003. European Patent Application No. 0 133 216 (corresponding to U.S. Pat. No. 4,581,321) describes a reversal process in which the o-quinonediazide-containing copying layer contains an additive comprising a hexamethylolmelamine ether which is preferably used as a crosslinking agent in polymer reactions, while European patent application No. 0 131 238 (corresponding to U.S. Pat. No. 4,576,901) discloses a reversal process in which the photosensitive material does not require any of the above-indicated basic or acidic additives.

There has also been disclosed a positive-negative reversal process based on acid-cleavable compounds instead of 1,2-quinonediazides, as described in European patent application No. 0 082 463 (corresponding to U.S. Pat. No. 4,506,006).

The known reversal processes basically comprise the same sequence of processing steps, including heating the printing plate after image-wise exposure, re-exposing the cooled plate without an original and then developing by means of an aqueous-alkaline developer.

The prior art reversal processes are based on the fact that the photodecomposition products produced form an insoluble reaction product when they are heated. This thermal hardening preferably takes place in the presence of particular basic or acidic additives in the copying layer or in the presence of particular crosslinking agents having multifunctional reactive groups.

Additives of this kind, however, usually have an adverse influence on the shelf life of the copying material and on particular copying properties, for example, photosensitivity and image contrast after exposure. In addition, for many applications the temperature required for image reversal is undesirably high, the duration of heating at a relatively low temperature is too long, or the temperature range for the reversal process is too narrow.

In the reversal process described in European Patent Application 0 133 216, the copying layer contains, in addition to a 1,2-quinonediazide, an ether of hexamethylolmelamine as an essential constituent. Although such melamine ethers advantageously promote the image reversal in the exposed images areas during thermal treatment of a normally positive-working photosensitive material, they, nevertheless, have the disadvantage that the temperature tolerances of the reversal range are insufficient, which may give rise to varying copying results. It is also a disadvantage that, due to the presence of the reactive ether groups, the printing plates have a poor shelf life, in particular at elevated temperatures, which leads to an undesirable premature crosslinking and adversely influences the usability of the plates.

German patent application, File No. P 37 11 263.5 of Apr. 3, 1987, (corresponding to U.S. application. Ser. No. 177,411, filed Apr. 4, 1988) has proposed a both positive and negative-working photosensitive composition containing, as the substance promoting thermal hardening, a symmetric triazine-alkyl(aryl)ether which may carry a dialkylamino group on a carbon atom. It is, however, a disadvantage that, due to the strong basicity of this moiety, the acid produced upon exposure in the presence of appropriate photochemical acid formers is no longer sufficient for obtaining a color change in the exposed layer areas of the copying layer dyed with an indicator dye. In practical application, this lack in image contrast leads to faulty copies, in particular, when exposure is carried out in so-called step-and-repeat machines, in which a single diapositive, for example, for the printing of labels, is repeatedly projected, side by side, onto the printing plate. Since, after exposure, there is only a weak contrast between image and non-image areas on the printing plate, especially when viewing the plate in yellow light, as is necessary in the processing of photosensitive printing plates, an accurate and space-saving positioning of the diapositive may be very difficult. As against this, 2,4,6-triphenoxy-s-triazine which has also been proposed possesses a lower basicity and thus does not have the above-described adverse influence on the image contrast resulting after exposure, but it has the disadvantage that it is relatively sparingly soluble in the organic solvents customarily used for preparing coating solutions. Upon drying of the coating solution applied to the support this compound is thus prematurely precipitated and, as a result, a non-uniform and, consequently, inadequate coating quality is obtained.

SUMMARY OF THE INVENTION

It is therefore an object of the present invention to provide a photosensitive composition, a copying material prepared from this composition and a reversal process performed by means of the material so prepared, which material does not have the above-indicated disadvantages, but possesses a good shelf life, even at elevated temperature, and shows relatively large processing tolerances when it is thermally treated.

In accordance with these and other objects of the invention, there is provided a photosensitive composition comprising a photosensitive composition comprising a binder that is insoluble in water and soluble in aqueous-alkaline solutions, one of a photosensitive 1,2-quinonediazide and a photosensitive mixture comprising a compound which splits off acid upon exposure to light and a compound containing at least one acid-cleavable C-O-C group, and a symmetric triazine-alkyl-(aryl)-ether as a substance which promotes thermal hardening comprising a compound of the general formula I

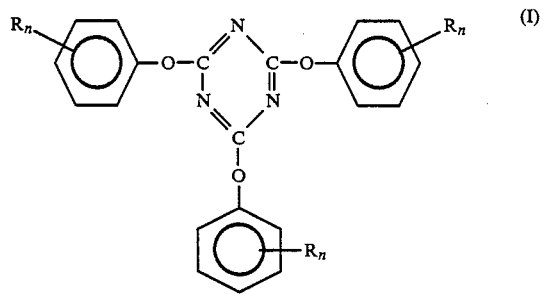

wherein
R denotes alkyl, allyl, alkoxy, alkoxycarbonyl, alkoxycarbonylalkenyl, each having from 1 to 4 carbon atoms in the alkyl or alkenyl group, aryloxy, halogen or a nitro group and
n is 1 to 3.

A photosensitive copying material comprising a photosensitive layer of the composition on a support and processes for producing negative relief copies using this copying material are also provided. A first process comprises the steps of image-wise exposing the photosensitive layer of the copying material, heating the exposed layer, cooling the exposed layer, overall exposing the layer, and developing the layer with an aqueous-alkaline developer. A second process comprises the steps of image-wise exposing the photosensitive layer of the copying material to produce exposed and unexposed areas, heating the exposed layer, cooling the exposed layer, image-wise exposing the previously unexposed areas to produce additional exposed areas, and developing the layer with an aqueous-alkaline developer.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The photosensitive composition according to the invention comprises a binder which is insoluble in water and soluble in aqueous-alkaline solutions, a photosensitive 1,2-quinonediazide or a photosensitive mixture comprising a compound which splits off acid upon exposure to light and a compound containing at least one acid-cleavable C-O-C group, and a symmetric triazine-alkyl(aryl)-ether as a substance which promotes thermal hardening, wherein a compound of the general formula I

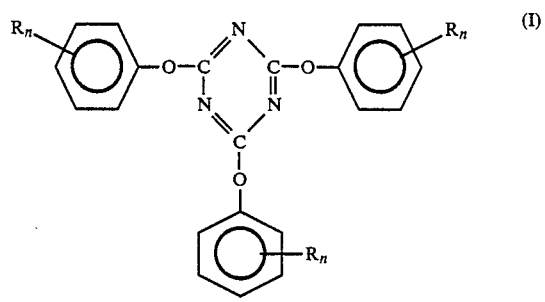

wherein
R denotes alkyl, allyl, alkoxy, alkoxycarbonyl, alkoxycarbonylalkenyl, each having from 1 to 4 carbon atoms in the alkyl or alkenyl group, aryloxy, halogen or a nitro group and
n stands for 1 to 3, is present as the substance promoting thermal hardening. Preferably, a compound of the general formula I is present, wherein
R denotes methyl, isobutyl, ethoxy, ethoxycarbonyl, methoxycarbonylethenyl, bromine or a nitro group and
n stands for 1 or 3.

2,4,6-tris-(4-methylphenoxy)-s-triazine, 2,4,6-tris(4-ethoxycarbonyl-phenoxy)-s-triazine and 2,4,6-tris(2,4,6-tribromophenoxy)-s-triazine have proved to be particularly advantageous.

The preparation of the aryloxy-s-triazines is basically known and is described, for example, in "The Journal of the American Chemical Society," Vol. 73 (1951), page 2990, the contents of which are hereby incorporated by reference.

The compounds are most advantageously prepared by reacting 1 mole of cyanuric chloride with 3 moles of an appropriately substituted phenol. For this purpose, the two reactants are dissolved in dioxane; 3 moles of finely powdered sodium hydroxide are slowly added with vigorous stirring at room temperature and the reaction mixture is then kept for about 3 hours at 80.C, while continuously stirring. Upon completion of the reaction, the reaction mixture is stirred into water which has been slightly acidified with hydrochloric acid. In the process, the reaction product precipitates in a good yield.

The trisaryloxy-s-triazines of the invention, that are substituted on the phenyl ring are distinguished by their good solubility in the customary organic solvents. They also do not tend to premature crystallization when the coating solution applied to a support is dried in the coating line.

The concentration of the symmetric triazines of the invention in the photosensitive composition may vary within relatively wide limits. They are generally present in an amount of from about 0.5 to 30% by weight, preferably from about to 15% by weight, based on the weight of the non-volatile constituents on the photosensitive composition.

It is a great advantage that during the positive-negative reversal step the s-triazines according to the invention impart high stability against undesired temperature influences to the photosensitive composition and the copying material prepared therefrom. This results in relatively large processing tolerances during the heat-treatment required for the reversal process without prejudicing tonal rendering, even in the case of temperature variations. The procedure followed in the production of printing forms is thus considerably facilitated. It is also an advantage that in the presence of the s-triazines of the invention, the image contrast after exposure, which is required for practical application, is not adversely influenced.

Sensitizers that are suitable for use in the composition of the present invention and the copying material prepared therefrom, comprise 1,2-quinonediazide-sulfonic-acid esters and amides, 1,2-quinonediazide-carboxylic-acid esters and amides, that are rendered soluble in aqueous-alkaline solutions after exposure to actinic radiation. These include the reaction products of 1,2-benzoquinone or 1,2-naphthoquinonediazide-4 or -5-sulfonic acid or of the acid chlorides thereof with phenolaldehyde/acetone condensation products or with polymers of p-hydroxystyrene, p-aminostyrene or copolymers thereof. The 1,2-quinonediazide-sulfonic-acid-4-esters are particularly useful sensitizers.

Suitable esters of the 1,2-quinonediazide derivatives include the well-known reaction products of the acids or their halides with phenols, in particular, polyhydric phenols, for example with 2,3,4-trihydroxybenzophenone, 2,4-dihydroxybenzophenone, or 4,4-bis-(4-hydroxyphenyl)-valeric acid butylester. The esterification product of 1 mole of 4-(2-phenylprop-2-yl)-phenol and 1 mole of 1,2-naphthoquinone-2-diazide-4-sulfonic acid chloride has proved particularly advantageous.

The quantity of o-quinonediazide compounds generally ranges from about 3 to 50% by weight, preferably from about 10 to 30% by weight, based on the non-volatile constituents of the photosensitive composition or the copying layer, respectively.

A great number of known compounds and mixtures, such as phosphonium, sulfonium and iodonium salts, halogen compounds and organometal/organohalogen combinations, are suitable for use as the photosensitive components that form strong acids upon exposure to light.

As a rule, the above-mentioned phosphonium, sulfonium and iodonium compounds are used in the form of their salts which are soluble in organic solvents, usually as a precipitate with complex acids, for example, tetrafluoroboric acid, hexafluorophosphoric acid, hexafluoroantimonic acid and hexafluoroarsenic acid.

As the halogen-containing photosensitive compounds which form hydrohalogenic acid any organic halogen compounds can basically be used, which are also known as photochemical free-radical initiators, for example, those which have more than one halogen atom on a carbon atom or on an aromatic ring. Examples are described in U.S. Patents 3,515,552; 3,536,489 and 3,779,778, in German Patent No.26 10 842 and in German Offenlegungsschriften No.22 43 621; 27 18 259 and 33 37 024. Of these compounds, the s-triazine derivatives are preferred that contain 2 methyl halide groups, in particular trichloromethyl groups, and an aromatic or unsaturated substituent, respectively, in the triazine nucleus, as described in German Offenlegungsschriften No. 27 18 259 and 33 37 24. The 2-trichloromethyl-1,3,4-oxadiazoles described in German Offenlegungsschriften No. 28 51 471 and 29 49 396 are likewise well suited. The effect of these halogen-containing compounds can also be spectrally influenced and enhanced by known sensitizers.

Examples of suitable photochemical acid formers are:
4-methyl-6-trichloromethyl-2-pyrone,
4-(3,4,5-trimethoxystyryl)-6-trichloromethyl-2-pyrone,
2-(4-methoxystyryl)-6-(3,3,3-trichloropropenyl)-2-pyrone,
2-trichloromethylbenzimidazole,
2-tribromomethylquinoline,
2,4-dimethyl-1-tribromoacetylbenzene,
3-nitro-1-tribromoacetylbenzene,
4-dibromoacetyl-benzoic acid,
1,4-bis-dibromomethylbenzene,
tris-dibromomethyl-s-triazine,
2-(6-methoxy-naphth-2-yl)-,
2-(naphth-1-yl)-,
2-(naphth-2-yl)-,
2-(4-ethoxyethyl-naphth-1-yl)-,
2-(benzopyran-3-yl)-,
2-(4-methoxyanthrac-1-yl)-,
2-(4-styrylphenyl)-,
2- phenanthr-9-yl)-4,6-bis-trichloromethyl-s-triazine,
and the compounds specified in the examples. The quantity of the photochemical acid former can also vary widely depending on its chemical nature and on the composition of the layer. Favorable results are obtained using from about 0.5 to 20% by weight, preferably from about 1.0 to 12% by weight, based on total solids. In particular in photosensitive layers having thicknesses over about 0.01 mm it is advisable to use a relatively small amount of acid donor.

Acid-cleavable compounds include:
(A) Compounds containing at least one orthocarboxylic acid ester and/or carboxylic acid amide acetal moiety; the compounds can also have a polymeric character and the moieties mentioned can be present as linking members in the principal chain or as lateral substituents,
(B) oligomeric or polymeric compounds containing recurrent acetal and/or ketal moieties in the principal chain, and
(C) compounds containing at least one enol ether or N-acyliminocarbonate moiety.

Acid-cleavable compounds of type (A) used as components of photosensitive compositions are described in detail in U.S. Pat. No. 4,101,323 and in European Patent Application No. 0 022 571; compositions containing compounds of type (B) are described in German Patents Nos. 23 06 248 and 27 18 254 and in U.S. Pat. No. 3,779,778; and compounds of type (C) are described in European Patent Application Nos. 0 006 626 and 0 006 727.

The amount of cleavable compound used may be varied between about 4 and 50% by weight, preferred is an amount of from about 5 to 30% by weight, based on total solids.

The photosensitive compositions preferably also contain a polymeric, water-insoluble resinous binder, which dissolves in the solvents used for the compositions and is also soluble or at least swellable in aqueous alkalis.

The novolac condensation resins that are widely used in many positive copying materials based on naphthoquinonediazides have also proved advantageous for use as binders in the process of the present invention. The novolacs can also be modified in a known manner, by reacting part of their hydroxy groups with, for example, chloroacetic acid, isocyanates, epoxides, or carboxylic acid anhydrides. Further preferred binders that are soluble or swellable in alkali include polyhydroxyphenyl resins prepared by condensation of phenols with aldehydes or ketones, copolymers of styrene and maleic anhydride, polyvinylphenols, or copolymers of acrylic acid or methacrylic acid, in particular with acrylic or methacrylic acid phenolesters. The type and quantity of the binders used may vary depending on the intended application; preference is given to quantities ranging between about 90 and 30% by weight, in particular between about 85 and 55% by weight, based on total solids.

A great number of other resins can additionally be employed, for example, epoxy resins and vinyl polymers, such as polyvinyl acetates, polyacrylates, polyvinyl acetals, polyvinyl ethers, polyvinylpyrrolidones, and the copolymers of the monomers on which these resins are based and also hydrogenated or partially hydrogenated colophony derivatives. The most favorable proportion of these resins depends on application-related requirements and on their influence on development conditions. It generally does not exceed about 50% by weight, and is preferably from about 2 to 35% by weight, of the binder used. To meet special requirements, such as flexibility, adhesion, gloss and coloration, the photosensitive composition can also contain small amounts of substances, such as polyglycols, cellulose derivatives, e.g. ethyl cellulose, surfactants, dyes, adhesion promoters and finely divided pigments and, if required, UV absorbers.

To effect color change after exposure, the photosensitive composition can also be admixed with small amounts of radiation-sensitive components which preferably form or split off strong acids upon exposure and cause a color change in a subsequent reaction with a suitable dye. Such radiationsensitive components include, for example, 1,2-naphthoquinone-diazide-4-sulfonic acid chloride, bis-or trishalogenomethyl-s-triazines containing chromophoric substituents, or diazonium compounds in the form of their salts with complex acids, such as tetrafluoroboric acid or hexafluorophosphoric acid.

The invention also pertains to a photosensitive, normally positive-working copying material comprising a support and a photosensitive layer which is applied to the support and comprises the above-described photosensitive composition.

For coating a suitable support, the compositions are usually dissolved in a solvent. The selection of solvents depends on the intended coating process, the layer thickness and the drying conditions. Suitable solvents for the composition of the invention include ketones, such as methyl ethyl ketone; chlorinated hydrocarbons, such as trichloroethylene and 1,1,1-trichloroethane; alcohols, such as n-propanol; ethers, such as tetrahydrofuran; alcohol ethers, such as ethylene glycol monoethyl ether; and esters, such as butyl acetate. It is also possible to use mixtures which, for special purposes, may additionally contain solvents, such as acetonitrile, dioxane or dimethyl foramide. In principle any solvents can be used that do not irreversibly react with the layer components. Partial ethers of glycols, in particular ethylene glycol monomethyl ether and propylene glycol methyl ether, used alone or in mixtures, are particularly preferred.

In most cases, the supports used for layer thicknesses of less than about 10 μm are metals. The following can be used for offset printing plates: mill-finished, mechanically or eletrochemically grained and optionally anodically oxidized aluminum, which additionally may have been chemically pretreated, for example, with polyvinylphosphonic acid, silicates, phosphates, hexafluorozirconates or with hydrolyzed tetraethyl orthosilicate.

Coating of the support is carried out in a known manner by means of spin-coating, spraying, dipping, roller-coating, application with slot dies, blade-spreading or flow-coater application. For exposure, customary light sources are used.

The invention also relates to a process for the production of negative relief copies, in which a normally positive-working photosensitive copying material comprising a support coated with a photosensitive layer of the above-described photosensitive composition is used, which is exposed imagewise, thereafter heated and, after cooling, subjected to an overall exposure. It is then developed by means of an aqueous-alkaline developer and optionally subsequently baked.

The process according to the present invention is also suitable for the production of relief copies which reproduce both negative and positive images. For this purpose, the copying material is exposed imagewise under a negative original, thereafter heated and, after cooling, exposed under a positive original in the areas not yet subjected to imagewise exposure. It is then developed by means of an aqueous-alkaline developer.

For the reversal treatment, the copying material is, after imagewise irradiation or exposure under a negative original heated without any further intermediate treatment. Heating can be effected by irradiation, convection, contact with heated surfaces, for example, rolls, or by immersion in a heated bath comprising an inert liquid, for example, water. The heating temperature ranges between about 80° and 150° C., in particular, between about 100° and 130° C. These temperatures are tolerated by the compositions of the present invention without any significant change in the properties of the unexposed areas. The duration of heating the copying material can vary widely, depending on the method chosen for the application of heat. If a heat transferring medium is used, the heating time ranges between about 10 seconds and 10 minutes, in particular between about 1 and 3 minutes Following heating and cooling, the printing plate is subjected to overall exposure, in order to completely convert the still photosensitive layer areas into their photodecomposition products For re-exposure, the light source used in the imagewise exposure can advantageously be used again.

Re-exposure is followed by developing with customary developers. In the process, the layer areas that were not struck by light in the original imagewise exposure are washed off. Suitable developers preferably comprise aqueous solutions of alkaline substances having a graduated alkalinity, for example, of alkali-metal phosphates, silicates, carbonates, or hydroxides. The pH range is usually between about 10 and 14. The developer can additionally contain surfactants or minor amounts of organic solvents In particular cases, suitable developers also comprise organic solvents or mixtures of organic solvents with water. The material can be developed either immediately after heating and cooling, or after a time interval of, for example, several hours, without any attack occurring in the hardened layer areas.

To increase the print run, the printing forms can, if necessary, be baked, i.e. heated, in a temperature range from about 210 to 250° C., in the course of about 5 minutes.

The copying material of the present invention has a good shelf life, even at elevated temperature. The imagewise exposed layer areas are relatively quickly hardened under the action of heat; the heating temperature required for the reversal step is lower and the dwell time at elevated temperature is considerably shorter than in the materials known in the art.

It is also an advantage of the process of the invention that, in the presence of the s-triazines used according to the present invention in the copying layer, temperature tolerances of the reversal range are relatively large, such that tonal rendering is not adversely influenced, even in the case of considerable temperature variations during the reversal step.

The 2,4,6-tris-(aryloxy)-s-triazines of the present invention, that are substituted on the phenyl ring are distinguished by their good solubility in the solvents customarily used for the coating procedure. Furthermore, the image contrast that must be present after exposure of the copying material is not adversely influenced by the compounds according to the invention.

As already mentioned, the copying materials of the present invention can be used for the production of a negative copy from the normally positive-working copying layer and they can moreover advantageously be used to materialize various possibilities of combining line and screen films by exposing them together on the same plate (photocomposing). Immediately after the first imagewise exposure under a negative original, for example, a further line or screen image can be subsequently produced with the aid of a positive original, in the layer areas not yet struck by light, i.e., that were covered by a mask during the first exposure. The printing plate thus exposed is then developed without any further intermediate steps. In this manner, the final printing form is obtained.

In a modification of the process of the present invention the copying material is, accordingly, used for producing negative and positive originals on the same copying layer and is, after cooling, exposed imagewise in the still unexposed, previously covered layer areas with the aid of additional originals and then developed by means of an aqueous-alkaline developer.

Additional treatment steps in which liquids are used, or a special composition of the photosensitive material are not required. The only additional treatment step, i.e., heating, can usually be easily carried out with the aid of existing drying apparatus. Re-exposure without an original is most simply performed with the light source used for imagewise exposure.

The process of the present invention can, for example, be used in the production of printing forms for letterpress, gravure and planographic printing, in the production of photoresist stencils for the subtractive and additive preparation of printed circuit boards, in the production of nickel screenprinting cylinders prepared by an electroplating process, and in the production of masks in microelectronics according to the lift-off technique.

In the examples which follow, preferred embodiments of the process according to the present invention are described. Percentages and quantitative ratios are to be understood as units of weight, unless otherwise specified.

EXAMPLE 1

An electrolytically grained and anodized aluminum sheet was coated with a solution of 1.80 parts by weight of the esterification product of 1 mole of 4-(2-phenylprop-2-yl)phenol and 1 mole of 1,2-naphthoquinone-2-diazide-4-sulfonic acid chloride, 1.50 parts by weight of a cresol-formaldehyde novolac having a softening point in the range from 115° to 125° C., 6.00 parts by weight of a copolymer of methacrylic acid-2-hydroxyphenyl ester and styrene in a molar ratio of 70:30, 0.04 part by weight of 2,4-bis-trichloromethyl-6-p-stilbenyl-s-triazine, 0.90 part by weight of 2,4-dihydroxybenzophenone, 0.50 part by weight of 2,4,6-tris-(4-ethoxycarbonylphenoxy)-s-triazine and 0.07 part by weight of Crystal Violet in 90.00 parts by weight of propylene glycol monomethyl ether, and 70.00 parts by weight of tetrahydrofuran.

Before applying the solution, the anodized aluminum support had been treated with an aqueous solution of polyvinyl phosphonic acid, as described in German Patent No. 16 21 468 (corresponding to U.S. Pat. No. 4,153,461).

The presensitized copying material prepared in this manner, in which the photosensitive layer had a dry layer weight of about 2.3 g/m2, was exposed imagewise for 60 exposure units under a transparent positive original using a 5,000 watts metal-halide lamp arranged at a distance of 103 cm, and was then developed with a 4% strength solution of sodium silicate. In the developing procedure, the portions of the copying layer that had been struck by light were removed and the unexposed image areas remained on the support, so that a printing stencil corresponding to the original was obtained. Inking with a greasy printing ink yielded a positive printing form that was ready for printing.

Another sample of the same presensitized copying material was processed to give a negative printing plate. For this purpose, the sample was exposed as indicated above, under a negative original, thereafter heated for 2 minutes at 130° C. and then re-exposed without an original, for the same time as used in the imagewise exposure. After developing in the above-described developer for the same period of time, a reversed image of the original was obtained.

It is also possible to process the material according to the photocomposing method, i.e., by the subsequent exposure under line or screen originals onto a printing plate which has already been exposed imagewise. For this purpose the above-described presensitized copying material is first exposed imagewise under a negative original, as indicated above, thereafter heated for 2 minutes at 130° C., and then again exposed under a diapositive, in the layer areas not yet struck by light, i.e., which were covered during the first exposure. The material repeatedly exposed in this manner is developed without any further intermediate steps and, as a result, the final printing plate is obtained.

As compared with the hitherto known reversal plates and processes, the present invention offers the great advantage of a relatively large treatment range during the heating step. This becomes apparent when the normally positive-working photosensitive printing plate prepared is exposed imagewise under a negative original, in the presence of a test wedge as customarily used in the imagewise exposure of offset printing plates, for example, the UGRA-Offset-Test Wedge 1982, and is thereafter subjected to the heating step required for image reversal.

When the imagewise exposed printing plate is, for example, heated for 2 minutes, the temperature can be varied between 105. and 150° C., without giving rise to any substantial visible change in the test image resulting after the subsequent overall reexposure and development. This large temperature tolerance of the actual reversal step during processing is very desirable in practice, since the copying behavior, such as the tonal rendering, is not adversely influenced, even in the case of relatively wide temperature variations, that may occur in the heating ovens or automatic converting apparatus customarily used in practice.

If the 2,4,6-tris-(4-ethoxycarbonyl-phenoxy)-s-triazine used according to the present invention is, for example, replaced by the same quantity of a hexamethylol melamine hexamethyl ether according to European Patent Application 0 133 216 and after imagewise exposure under the same test original, the heating step is likewise carried out for 2 minutes, the resulting treatment range is only about 20° C.

The excellent shelf life of the copying material according to the present invention becomes apparent when the printing plate prepared is subjected to a storage test at 100° C. The printing plate of the present invention, that has been stored for 4 hours and then exposed imagewise can still be perfectly developed, while a printing plate containing hexamethylol melamine hexamethyl ether, that has been stored for only 1 hour at 100° C. and then exposed imagewise can no longer be faultlessly developed.

In the following examples further coating solutions are specified, which yield results similar to those indicate in Example 1. Unless specifically mentioned, preparation and processing of the printing plates obtained with these coating solutions are carried out under the conditions described in Example 1.

EXAMPLE 2

The coating solution comprises:
0 parts by weight of the esterification product of 1 mole of 4-(2-phenylprop-2-yl)phenol and 1 mole of 1,2-naphthoquinone-2-diazide-4-sulfonic acid chloride,
8.50 parts by weight of a cresol-formaldehyde novolac having a softening point in p the range from 127 to 145° C.,
0.60 part by weight of 2,4,6-tris-(4-methylphenoxy)-s-triazine,
0.04 part by weight of 2,4-bis-trichloromethyl-6-p-stilbenyl-s-triazine,
0.90 part by weight of 2,4-dihydroxybenzophenone, and
0.08 part by weight of Crystal Violet in 90.00 parts by weight of propylene glycol monomethyl ether and
60.00 parts by weight of tetrahydrofuran.

EXAMPLE 3

The coating solution comprises:
1.60 parts by weight of the esterification product of 1 mole of 4-(2-phenylprop-2-yl)phenol and 1 mole of 1,2-naphthoquinone-2-diazide-4-sulfonic acid chloride,
8.50 parts by weight of a cresol-formaldehyde novolac having a softening point in the range from 127 to 145° C.,
0.50 part by weight of 2,4,6-tris-(4-isobutylphenoxy)-s-triazine,
0.04 part by weight of 2,4-bis-trichloromethyl-6-p-methoxystyryl-s-triazine,
0.80 part by weight of 2,4-dihydroxybenzophenon and
0.07 part by weight of Crystal Violet in a mixture comprising
90.00 parts by weight of propylene glycol monomethyl ether and
60.00 parts by weight of tetrahydrofuran.

EXAMPLE 4

The coating solution comprises:
1.60 parts by weight of the esterification product of 1 mole of 4-(2-phenylprop-2-yl)-2,6-dibromophenol and 1 mole of 1,2-naphthoquinone-2-diazide-4 sulfonic acid chloride,
8.50 parts by weight of a cresol-formaldehyde novolac having a softening point in the range from 127 to 145° C.,
0.50 part by weight of 2,4,6-tris-(4-nitrophenoxy)-s-triazine,
0.04 part by weight of 2,4-bis-trichloromethyl-6-p-stilbenyl-s-triazine,
0.80 part by weight of 2,4-dihydroxybenzophenone, and
0.07 part by weight of Crystal Violet in a mixture comprising
90.00 parts by weight of propylene glycol monomethyl ether and
60.00 parts by weight of tetrahydrofuran.

EXAMPLE 5

An electrochemically grained and anodized aluminum sheet was coated with a solution of:
60 parts by weight of a polyacetal prepared from triethylene glycol and 2-ethylbutyraldehyde,
0.30 part by weight of 2,4-bis-trichloromethyl-6-p-stilbenyl-s-triazine,
4.80 parts by weight of a cresol-formaldehyde novolac having a softening point in the range from 127 to 145° C.,
0.50 part by weight of 2,4,6-tris-(4-ethoxycarbonyl-phenoxy)-s-triazine,
0.05 part by weight of Crystal Violet base in
50.00 parts by weight of propylene glycol monomethyl ether and
30.00 parts by weight of tetrahydrofuran.

The highly photosensitive copying material thus prepared was exposed imagewise for 20 exposure units under a transparent positive original, using a 500 watts metal halide lamp arranged at a distance of 103 cm and was then developed with a 6% strength solution of sodium silicate. After developing a positive printing stencil corresponding to the original was obtained.

Another sample of the same presensitized copying material was processed to give a negative printing plate. For this purpose, the sample was exposed as indicated above, under a negative original and was thereafter heated for 2 minutes at 130° C. and then re-exposed without an original for the same time as used for the imagewise exposure. Upon developing in the same developer a reversed image of the original was obtained. The reversal range i.e., the temperature range within which the imagewise exposed printing plate can be heated for 2 minutes without impairing its copying behavior, was from 80° to 143° C.

EXAMPLE 6

The coating solution comprises:
1.60 parts by weight of the esterification product of 1 mole of 4-(2- phenylprop-2-yl)phenol and 1 mole of 1,2-naphthoquinone-2-diazide-4-sulfonic acid chloride,
1.40 parts by weight of a cresol-4-isobutylphenol-formaldehyde novolac having a softening point in the range from 115° to 125° C.,
6.00 parts by weight of a copolymer of methacrylic acid-2-hydroxyphenyl ester and styrene in a molar ratio of 70:30,
0.70 part by weight of 2,4,6-tris-(2,4,6-tribromo phenoxy)-s-triazine,
0.70 part by weight of bis-(4-hydroxyphenyl)sulfone,
0.04 part by weight of 2,4-bis-trichloromethyl-6-p-stilbenyl-s-triazine, and
0.07 part by weight of Crystal Violet in
90.00 parts by weight of propylene glycol monomethyl ether and
60.00 parts by weight of tetrahydrofuran.

The printing plate obtained using this solution is prepared and processed as described in Example 1. Equally good copying results are achieved, in particular, an excellent image contrast after exposure and after development and a relatively large reversal range extending from 110° to 150° C.

EXAMPLE 7

The coating solution comprises:
1.60 parts by weight of the esterification product of 1 mole of 4-(2-phenylprop-2-yl)-phenol and 1 mole of 1,2-naphthoquinone-2-diazide-4-sulfonic acid chloride,
8.50 parts by weight of a cresol-formaldehyde novolac having a softening point in the range from 127° to 145° C.
0.70 part by weight of 2,4,6-tris-4-methoxycarbonyl-ethene-phenoxy)-s-triazine,
0.04 part by weight of 2,4-bis-trichloromethyl-6-p-stilbenyl-s-triazine,
0.90 part by weight of 2,4-dihydroxybenzophenone and
0.08 part by weight of Crystal Violet in
90.00 parts by weight of propylene glycol monomethyl ether and
60.00 parts by weight of tetrahydrofuran.

What is claimed is:
1. A photosensitive composition comprising in admixture:
 a polymeric binder which is insoluble in water and soluble in aqueous-alkaline solutions present in an amount sufficient to form a uniform film;
 one of a photosensitive 1,2-quinonediazide and a photosensitive mixture comprising a compound which splits off acid upon exposure to light and a compound containing at least one acid-cleavable C-O-C group; and
 a symmetric triazone-alkyl(aryl)-ether as a substance which promotes thermal hardening comprising a compound of the general formula I

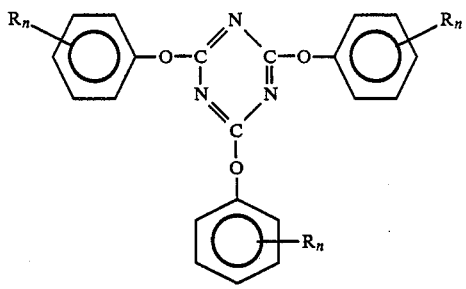

wherein
R denotes alkyl, allyl, alkoxy, alkoxycarbonyl, alkoxycarbonylalkenyl, each having from 1 to 4 carbon atoms in the alkyl or alkenyl group, aryloxy, halogen or a nitro group and
n is 1 to 3.
wherein the photosensitive compound or mixture is present in an amount sufficient to render exposed areas soluble in developer and the thermal-hardening substance is present in an amount sufficient to cause hardening of exposed areas under the action of heat.
2. A photosensitive composition as claimed in claim 1, wherein a compound of the general formula I is present, wherein
 R denotes methyl, isobutyl, ethoxy, ethoxycarbonyl, methoxycarbonylethenyl, bromine or a nitro group and
 n is 1 or 3.
3. A photosensitive composition as claimed in claim 1, which contains from about 0.5 to 30% by weight, based on the weight of the non-volatile constituents of the photosensitive composition, of a compound corresponding to the general formula I.
4. A photosensitive composition as claimed in claim 1, wherein the substance promoting thermal hardening is selected from the group consisting of 2,4,6-tris-(4-methylphenoxy)-s-triazine, 2,4,6-tris-(4-ethoxycarbonyl-phenoxy)-s-triazine and 2,4,6-tris-(2,4,6-tribromophenoxy)-s-triazine.
5. A photosensitive copying material comprising a support and a photosensitive layer on the support comprising a composition as claimed in claim 1.

* * * * *